(12) United States Patent
Stoisiek

(10) Patent No.: US 6,635,944 B2
(45) Date of Patent: Oct. 21, 2003

(54) POWER SEMICONDUCTOR COMPONENT HAVING A PN JUNCTION WITH A LOW AREA EDGE TERMINATION

(75) Inventor: Michael Stoisiek, Erlangen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/883,477

(22) Filed: Jun. 18, 2001

(65) Prior Publication Data

US 2002/0053718 A1 May 9, 2002

(30) Foreign Application Priority Data

Dec. 18, 1998 (DE) .......................... 198 58 762

(51) Int. Cl.⁷ .............................. H01L 29/00
(52) U.S. Cl. .................. 257/509; 257/367; 257/544
(58) Field of Search ................. 257/509, 544, 257/367

(56) References Cited

U.S. PATENT DOCUMENTS

| 4,672,738 A | 6/1987 | Stengl et al. |
| 4,757,031 A | 7/1988 | Kuhnert et al. |
| 5,113,237 A | 5/1992 | Stengl |

FOREIGN PATENT DOCUMENTS

DE 19858762.7 * 12/1998

* cited by examiner

Primary Examiner—Stephen D. Meier
Assistant Examiner—Monica Lewis
(74) Attorney, Agent, or Firm—Laurence A. Greenberg; Werner H. Stemer; Ralph E. Locher

(57) ABSTRACT

Component having a blocking pn junction having an edge termination structure which is formed by a further, more weakly doped region (5) and a trench (8) formed therein, said trench being filled with a dielectric. The dielectric material in the trench (8) diverts the equipotential areas from the horizontal in a very confined space in the vertical direction, with the result that the electric field can emerge from the component within a small region of the chip surface.

2 Claims, 1 Drawing Sheet

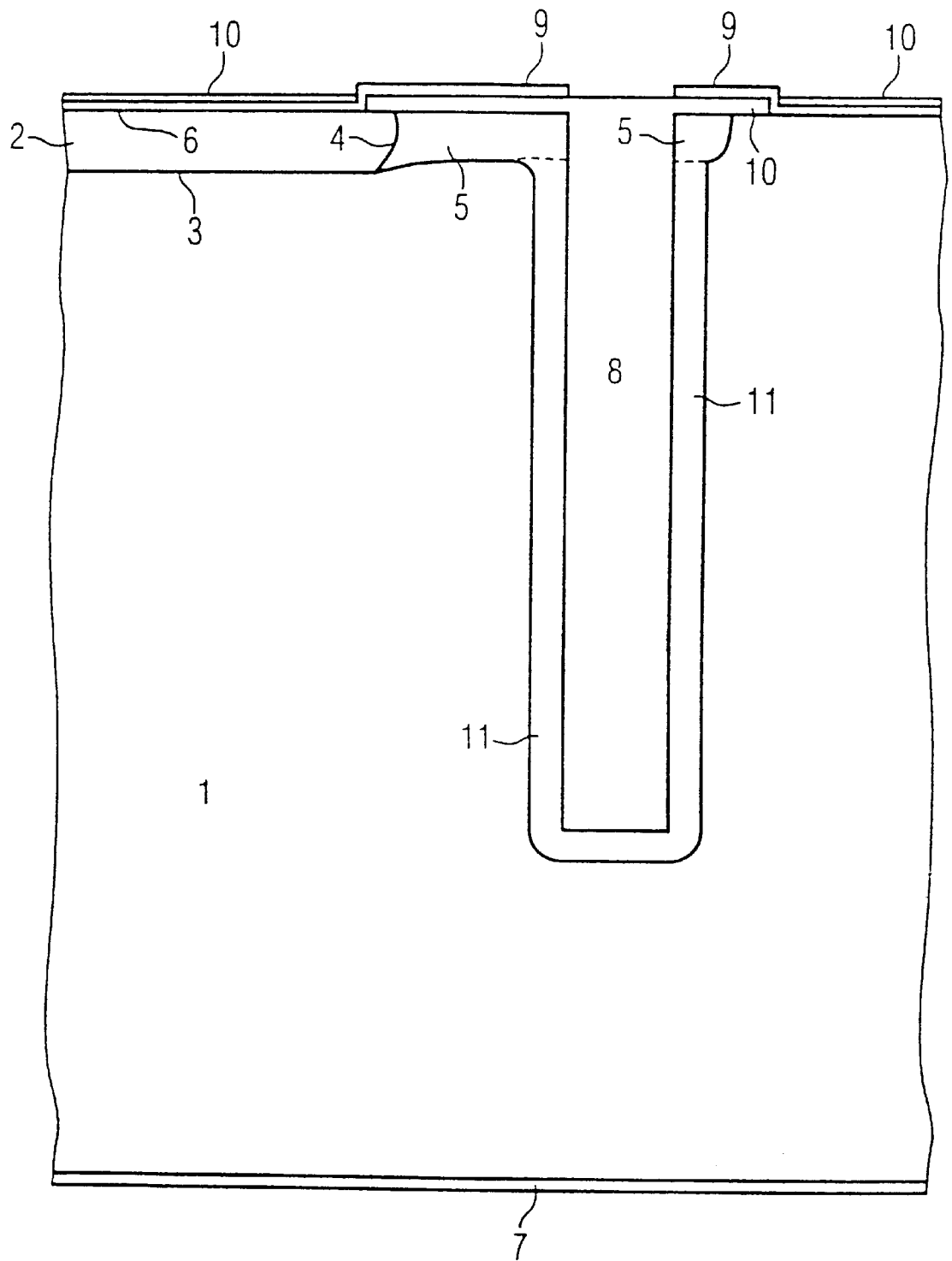

POWER SEMICONDUCTOR COMPONENT HAVING A PN JUNCTION WITH A LOW AREA EDGE TERMINATION

BACKGROUND OF THE INVENTION

Field of the Invention

The present invention relates to a power semiconductor component having a pn junction and an associated edge termination.

A pn junction which has a high blocking capability and, in the vertical direction, takes up a potential difference to be blocked, which pn junction extends (planar pn junction) only over a limited region of a semiconductor body, e.g. a monocrystalline silicon substrate, requires an edge termination structure in order to attain the dielectric strength. This edge termination structure is provided for the purpose of rotating the course of the electric field from a vertical orientation in the central region of the component to a horizontal course, i.e. parallel to the top side of the chip, in the edge region. Moreover, there must be a region of the chip surface present in which the electric field can emerge from the chip into the surroundings. In this case, the maximum dielectric strength of the pn junction in the planar central region, which is provided for the actual voltage blocking, should be reduced as little as possible by effects caused by the curvature of the area of the pn junction at the edge. Moreover, the region where the electric field emerges from the chip should be as small as possible. With known edge termination constructions, which usually comprise a suitable combination of differently doped regions and conductive field plates arranged above the latter, a width of the emergence region which is given by the quotient of required dielectric strength and breakdown field strength of silicon ($2*10^5$ V/cm) cannot, in principle, be undershot. Such edge terminations are described e.g. in U.S. Pat. No. 4,672,738, U.S. Pat. No. 4,757,031 and U.S. Pat. No. 5,113,237.

SUMMARY OF THE INVENTION

It is an object of the present invention to specify a component which is suitable for power applications and has an edge termination of a pn junction which requires the least possible chip area.

The component according to the invention has an edge structure by means of which the area requirement for the emergence of the electric field at the top side of the chip is significantly smaller than would be allowed by the breakdown field strength of the semiconductor material, in particular silicon. This is achieved by virtue of the fact that a dielectric incorporated in the semiconductor body and having a distinctly higher breakdown field strength than silicon deflects the electric field within the semiconductor body in such a way that the equipotential areas essentially run vertically to the top side of the chip through said dielectric. The electric field is therefore diverted by the central region of the component, in which the equipotential areas essentially run in a coplanar manner with respect to the top side of the chip, from the vertical direction in a horizontal direction with regard to the top side of the chip, which occurs over a comparatively short distance within the dielectric. In the region where the electric field emerges from the chip, the essential part of the field is situated in the dielectric. As a result, the area requirement is essentially limited to the surface region of the dielectric.

BRIEF DESCRIPTION OF THE DRAWINGS

The components according to the invention are described in more detail below using a typical example which is illustrated in a detail in cross section in the FIGURE.

DESCRIPTION OF THE PREFERRED EMBODIMENTS

In order to simplify the illustration, the FIGURE shows an example of a component in which a semiconductor body 1 provided with a basic doping has, on a main side, a region 2 which is formed there and, in order to form a pn junction 3, is doped for electrical conductivity having the opposite sign to the basic doping. The area of the pn junction 3 essentially runs in a coplanar manner with respect to the plane of the upper main side of the semiconductor body. At the edges, the area of the pn junction is curved toward said main side, with the result that edge areas 4 of the pn junction which are curved toward the vertical are present, which constitute an edge of the pn junction. In the component according to the invention, this is followed, on the outer side of the region 2, by a further doped region 5, which is doped for electrical conductivity of the same sign but with a lower concentration of dopant atoms. Within the region occupied by this further doped region, a dielectric region 8 is formed, which essentially extends perpendicularly to the main side of the semiconductor body. This dielectric region 8 bounds the further doped region 5 and projects into the region of oppositely doped semiconductor material to an extent such that the desired effect of deflecting the electric field is achieved. In order to be able to apply a voltage to the component, contacts 6, 7 are applied on the two mutually opposite main sides of the semiconductor body. The configuration of these contacts is arbitrary, in principle, depending on the exemplary embodiment. The contact 6 applied on the main side provided with the pn junction is preferably designed such that it projects beyond the structure forming the edge termination, with the result that electrical conductors 9 of planar construction, which are electrically insulated from the further doped region 5, e.g. by means of a dielectric layer 10, function as field plates above this region.

The blocking pn junction 3 is produced e.g. by diffusion of dopant into the region 2 with a penetration depth of approximately 3 μm and an edge concentration of, for example, $10^{17}$ cm$^{-3}$ in the n-doped silicon substrate with a homogeneous basic doping of a concentration of $4*10^{14}$ cm$^{-3}$ for example. The pn junction extends up to 7.5 μm, for example, in the lateral direction. This results in a breakdown voltage of the pn junction in the planar portion depicted on the left of approximately 500 V and a breakdown voltage at the edge of the pn junction without the edge termination structure according to the invention of approximately 190 V.

The dielectric region 8 can be produced e.g. by etching a trench into the semiconductor material. This trench is filled with a dielectric material which can also be used for the dielectric layer 10 on the top side. The trench filling used may be a dielectric material whose relative permittivity is less than that of silicon and whose breakdown field strength is greater than that of silicon, for example polyimide. When a semiconductor body made of silicon is used, it is also possible to fill the trench with the aid of thermal oxidation of silicon to form $SiO_2$. The silicon oxide resulting from the oxidation occupies a larger volume than the oxidized silicon. Preferably, the trench is not completely filled with the thermal oxide, in order to avoid mechanical stresses. A residual volume of the trench is filled by introducing a dielectric material.

The electrical conductors 9 of planar construction which function as field plates and may optionally be present in order to influence the distribution of the electric field in the semiconductor material in accordance with the desired form are preferably formed on oxide having a thickness of about 1 μm outside the region occupied by the dielectric region on the surface. When the pn junction is subjected to voltage loading during operation of the component, the equipotential areas run in a manner coming from the undisturbed region, shown on the left in the FIGURE, firstly in the horizontal direction with regard to the top side of the chip toward the dielectric region 8. In the vicinity of the dielectric region 8, the equipotential areas are already curved somewhat toward the upper main side of the semiconductor body. Owing to the different dielectric constants of the dielectric material in the dielectric region 8 and of the surrounding semiconductor material (e.g. $SiO_2$ and Si, respectively), the equipotential areas are deflected within the dielectric region 8 toward the surface of the chip and almost all of them are situated within the dielectric region when they emerge from the chip surface. Therefore, the semiconductor material shown further on the right in the FIGURE is largely shielded from the electric field by the dielectric region 8.

The action of the dielectric region 8 which deflects the electric field toward the chip surface is additionally supported by the fact that an inversion charge layer forms, in a manner adjoining the dielectric region 8, on the side remote from the pn junction 3, in the semiconductor material, said layer preventing the equipotential lines from emerging in this part of the component. In order that the required inversion charge carriers are available even in the event of fast switching operations of a voltage applied to the component, the further doped region 5 is preferably also formed on that side of the dielectric region 8 which is remote from the pn junction. To that end, a portion of the further doped region 5 is depicted on the right-hand side of the dielectric region 8 in the FIGURE.

What is essential for the functioning of the component structure according to the invention is that the region in which the electric field crosses from the semiconductor material into the dielectric material for the dielectric region 8 is large enough that the breakdown field strength of silicon is not exceeded there. Therefore, a thin zone 11 is preferably situated around the dielectric region 8 in the adjoining semiconductor material, said zone being doped for electrical conductivity of the same sign as the further doped region 5. Such a zone can be produced e.g. by diffusion of dopant atoms from the as yet unfilled trench into the surrounding semiconductor material. Only after this zone 11 has been formed is the trench filled with the dielectric material provided. Thus, it is additionally possible to set the size of the region where the electric field emerges from the semiconductor material into the dielectric material, and to optimally dimension the edge structure according to the invention. The concentration of dopant atoms in the zone 11 integrated perpendicularly to the boundary area of the dielectric region 8 must nowhere significantly exceed the value of $10^{12}$ cm$^{-2}$.

The proposed edge termination structure for the pn junction can be used, in principle, for all semiconductor components having a planar pn junction having a high blocking capability, such as e.g. for diodes, bipolar transistors, power MOS transistors, IGBTs and thyristors.

I claim:

1. A component, comprising:

a semiconductor body including two doped regions and a main side with a surface;

a pn junction located between said two doped regions;

a further doped region having an electrical conductivity with a first sign; and a zone doped having an electrical conductivity with the first sign;

said pn junction occupying a portion of a plane that is parallel to said main side, said pn junction having edges that run toward said surface of said main side, said pn junction having a side that faces said main side;

said two doped regions including a first doped region and a second doped region;

said second doped region having the electrical conductivity of the first sign;

said second doped region configured on said side of said pn junction that faces said main side, said second doped region being laterally surrounded by said further doped region, said further doped region having a lower doping concentration than that of said second doped region;

said further doped region having a dielectric region oriented essentially perpendicularly to said main side, said dielectric region extending into said first doped region opposite from said pn junction;

said zone surrounding said dielectric region;

said dielectric region defining a bounding area bounding said zone; and said zone having a doping concentration such that an integral of the doping concentration of said zone in a direction perpendicular to said bounding area of said dielectric region is not greater then $10^{12}$ cm$^{-2}$.

2. The component according to claim 1, comprising electrical conductors of planar construction located on said surface of said main side, said conductors covering at least a portion of said further doped region and being electrically insulated from said further doped region.

* * * * *

UNITED STATES PATENT AND TRADEMARK OFFICE
CERTIFICATE OF CORRECTION

PATENT NO.   : 6,635,944 B2
DATED        : October 21, 2003
INVENTOR(S)  : Michael Stoisiek It is certified that error appears in the above-identified patent and that said Letters Patent is hereby corrected as shown below:

<u>Title page,</u>
Item [63], Related U.S. Application Data, should read as follows:

-- Continuation of application No. PCT/DE99/03925, filed on Dec. 8, 1999. --

Signed and Sealed this

Sixteenth Day of December, 2003

JAMES E. ROGAN
*Director of the United States Patent and Trademark Office*